United States Patent
Chen et al.

(10) Patent No.: US 11,251,341 B2
(45) Date of Patent: Feb. 15, 2022

(54) MICRO LIGHT EMITTING DIODE DISPLAY PANEL, MICRO LIGHT EMITTING DIODE DISPLAY APPARATUS, AND METHOD OF FABRICATING MICRO LIGHT EMITTING DIODE DISPLAY PANEL

(71) Applicant: BOE Technology Group Co., Ltd., Beijing (CN)

(72) Inventors: Yu-Ju Chen, Beijing (CN); Jing Yu, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 313 days.

(21) Appl. No.: 16/484,212

(22) PCT Filed: Oct. 12, 2018

(86) PCT No.: PCT/CN2018/109998
§ 371 (c)(1),
(2) Date: Aug. 7, 2019

(87) PCT Pub. No.: WO2020/073305
PCT Pub. Date: Apr. 16, 2020

(65) Prior Publication Data
US 2021/0336095 A1     Oct. 28, 2021

(51) Int. Cl.
| | | |
|---|---|---|
| H01L 33/50 | (2010.01) | |
| H01L 27/15 | (2006.01) | |
| H01L 33/00 | (2010.01) | |
| H01L 33/62 | (2010.01) | |

(52) U.S. Cl.
CPC .......... *H01L 33/502* (2013.01); *H01L 27/156* (2013.01); *H01L 33/005* (2013.01); *H01L 33/62* (2013.01); *H01L 2933/0041* (2013.01); *H01L 2933/0066* (2013.01)

(58) Field of Classification Search
CPC ..... H01L 33/502; H01L 33/005; H01L 33/62; H01L 27/156; H01L 2933/0066; H01L 2933/0041
See application file for complete search history.

(56) References Cited

U.S. PATENT DOCUMENTS 10,193,042 B1*   1/2019   Tsai ..................... H01L 27/1214
2015/0279902 A1* 10/2015  Von Malm ............ H01L 27/156
                                                                257/88

(Continued)

FOREIGN PATENT DOCUMENTS

| CN | 104299529 A | 1/2015 |
| CN | 107393937 A | 11/2017 |
| CN | 207133458 U | 3/2018 |

OTHER PUBLICATIONS

International Search Report & Written Opinion dated Jun. 28, 2019, regarding PCT/CN2018/109998.

*Primary Examiner* — Jonathan Han
(74) *Attorney, Agent, or Firm* — Intellectual Valley Law, P.C.

(57) ABSTRACT

A micro light emitting diode (micro LED) display panel includes a carrier substrate layer; a plurality of vias respectively extending into the carrier substrate layer; a plurality of micro LEDs on the carrier substrate layer; and a wavelength conversion layer including a wavelength conversion material filled in the plurality of vias.

20 Claims, 5 Drawing Sheets

(56) References Cited

U.S. PATENT DOCUMENTS

| | | | |
|---|---|---|---|
| 2015/0362165 A1* | 12/2015 | Chu | H01L 27/156 |
| | | | 362/235 |
| 2017/0194304 A1* | 7/2017 | Takeya | H01L 25/162 |
| 2017/0338210 A1* | 11/2017 | Kim | H01L 27/124 |
| 2018/0047876 A1 | 2/2018 | Bedell et al. | |
| 2018/0269361 A1* | 9/2018 | Hayashi | H01L 33/38 |
| 2019/0252312 A1* | 8/2019 | Yu | H01L 25/16 |

* cited by examiner

MICRO LIGHT EMITTING DIODE DISPLAY PANEL, MICRO LIGHT EMITTING DIODE DISPLAY APPARATUS, AND METHOD OF FABRICATING MICRO LIGHT EMITTING DIODE DISPLAY PANEL

CROSS-REFERENCE TO RELATED APPLICATION

This application is a national stage application under 35 U.S.C. § 371 of International Application No. PCT/CN2018/109998, filed Oct. 12, 2018, the contents of which are incorporated by reference in the entirety.

TECHNICAL FIELD

The present invention relates to display technology, more particularly, to a micro light emitting diode display panel, a micro light emitting diode display apparatus, and a method of fabricating a micro light emitting diode display panel.

BACKGROUND

In recent years, miniaturized electro-optics devices are proposed and developed, including micro light emitting diode (micro LED). The micro LED-based display panels have the advantages of high brightness, high contrast ratio, fast response, and low power consumption. The micro LED-based display technology has found a wide range of applications in the display field, including smartphones and smart watches.

SUMMARY

In one aspect, the present invention provides a a micro light emitting diode (micro LED) display panel, comprising a carrier substrate layer, the micro LED display panel comprising a plurality of vias respectively extending into the carrier substrate layer; a plurality of micro LEDs on the carrier substrate layer; and a wavelength conversion layer comprising a wavelength conversion material filled in the plurality of vias.

Optionally, an orthographic projection of the wavelength conversion layer on a plane comprising the carrier substrate layer and an orthographic projection of the plurality of micro LEDs on the plane comprising the carrier substrate layer at least partially overlap with each other.

Optionally, the micro LED display panel further comprises an etch stop layer on a side of the carrier substrate layer distal to the plurality of micro LEDs and substantially outside a region corresponding to the plurality of vias, the etch stop layer and the carrier substrate layer defining a plurality of subpixel apertures of the micro LED display panel.

Optionally, the carrier substrate layer has a high etch selectivity with respect to the etch stop layer.

Optionally, the carrier substrate layer has a high etch selectivity with respect to the etch stop layer and a semiconductor layer of the plurality of micro LEDs most adjacent to the wavelength conversion layer.

Optionally, the etch stop layer comprises a material comprising $SiN_aO_b$, wherein (a+b)>0; and the carrier substrate layer comprises silicon.

Optionally, the micro LED display panel further comprises a plurality of through holes respectively extending through the carrier substrate layer; and a plurality of signal lines respectively connected to electrodes of the plurality of micro LEDs respectively through the plurality of through holes.

Optionally, the plurality of vias respectively extend through the carrier substrate layer.

Optionally, the wavelength conversion layer is in direct contact with a semiconductor layer of the plurality of micro LEDs most adjacent to the wavelength conversion layer.

Optionally, the wavelength conversion layer has a thickness greater than 10 µm.

Optionally, the wavelength conversion layer has a thickness substantially same as a thickness of the carrier substrate layer.

Optionally, the micro LED display panel further comprises a color filter layer on a side of the wavelength conversion layer distal to the plurality of micro LEDs; wherein an orthographic projection of the color filter layer on the plurality of micro LEDs substantially cover an orthographic projection of the wavelength conversion layer on the plurality of micro LEDs.

Optionally, the micro LED display panel further comprises a thin film transistor array substrate; wherein the plurality of micro LEDs are bound to the thin film transistor array substrate, the thin film transistor array substrate comprising a plurality of thin film transistors respectively configured to drive light emission of the plurality of micro LEDs; the carrier substrate layer is on a side of the plurality of micro LEDs distal to the thin film transistor array substrate; and orthographic projections of the plurality of micro LEDs on the thin film transistor array substrate substantially cover an orthographic projection of the wavelength conversion layer on the thin film transistor array substrate.

In another aspect, the present invention provides a micro light emitting diode (micro LED) display apparatus, comprising the micro LED display panel described herein or fabricated by a method described herein.

In another aspect, the present invention provides a method of fabricating a micro light emitting diode (micro LED) display panel, comprising forming a plurality of micro LEDs on a carrier substrate; forming a plurality of vias respectively extending into the carrier substrate, thereby forming a carrier substrate layer; and forming a wavelength conversion layer by filling a wavelength conversion material into the plurality of vias.

Optionally, prior to forming the plurality of vias respectively extending into the carrier substrate, the method further comprises forming an etch stop layer on the carrier substrate and substantially outside a region corresponding to the plurality of vias; wherein the etch stop layer is formed to define a plurality of subpixel apertures corresponding to the plurality of vias; and wherein, subsequent to forming the etch stop layer, the method further comprises selectively etching the carrier substrate using the etch stop layer as a mask plate and using a selective etchant to form the plurality of vias, the carrier substrate having a high etch selectivity with respect to the etch stop layer, thereby forming the carrier substrate layer, the etch stop layer and the carrier substrate layer being formed to define a plurality of subpixel apertures of the micro LED display panel.

Optionally, selectively etching the carrier substrate comprises etching through the carrier substrate using the selective etchant to form the plurality of vias extending through the carrier substrate layer, the carrier substrate has a high etch selectivity with respect to the etch stop layer and a semiconductor layer of the plurality of micro LEDs exposed by selectively etching.

Optionally, forming the wavelength conversion layer comprises forming the wavelength conversion layer in direct contact with the semiconductor layer of the plurality of micro LEDs exposed by selectively etching.

Optionally, the method further comprises forming a plurality of through holes respectively extending through the carrier substrate; and filling the plurality of through holes with a conductive material, the conductive material in each individual one of the plurality of through holes connected to an electrode of a respective one of the plurality of micro LEDs.

Optionally, the method further comprises forming a thin film transistor array substrate; and bonding the plurality of micro LEDs with the thin film transistor array substrate, the plurality of micro LEDs being respectively connected to a plurality of thin film transistors in the thin film transistor array substrate respectively configured to drive light emission of the plurality of micro LEDs.

Optionally, forming the plurality of vias respectively extending into the carrier substrate is performed subsequent to bonding the plurality of micro LEDs with the thin film transistor array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a micro light emitting diode display panel, a micro light emitting diode display apparatus, and a method of fabricating a micro light emitting diode display panel that substantially obviate one or more of the problems due to limitations and disadvantages of the related art. In one aspect, the present disclosure provides a micro LED display panel. In some embodiments, the micro LED display panel includes a carrier substrate layer, the micro LED display panel having a plurality of vias respectively extending into the carrier substrate layer; a plurality of micro LEDs on the carrier substrate layer; and a wavelength conversion layer including a wavelength conversion material filled in the plurality of vias.

Figure 1:
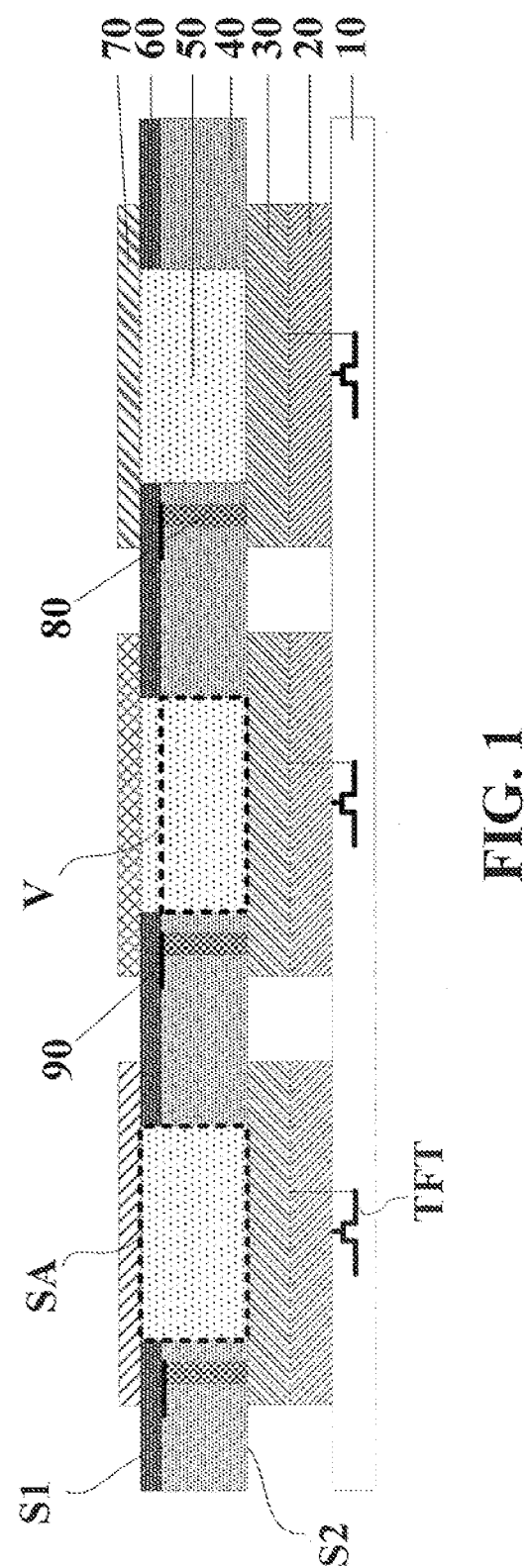
FIG. 1 is a schematic diagram illustrating the structure of a micro light emitting diode display panel in some embodiments according to the present disclosure.

FIG. 1 is a schematic diagram illustrating the structure of a micro light emitting diode display panel in some embodiments according to the present disclosure. Referring to FIG. 1, the micro LED display panel includes a carrier substrate layer 40, the micro LED display panel having a plurality of vias V respectively extending into the carrier substrate layer 40; a plurality of micro LEDs 30 on the carrier substrate layer 40; and a wavelength conversion layer 50 including a wavelength conversion material filled in the plurality of vias V. Optionally, the plurality of vias V extend through at least a first side S1 of the carrier substrate layer 40, the first side S1 is a side of the carrier substrate layer 40 facing away the plurality of micro LEDs 30. Optionally, referring to FIG. 1, the plurality of vias V extend through the carrier substrate layer 40, e.g., the plurality of vias V extend through both the first side S1 and a second side S2 of the carrier substrate layer 40, the first side S1 is a side of the carrier substrate layer 40 facing away the plurality of micro LEDs 30 and the second side S2 is a side of the carrier substrate layer 40 facing the plurality of micro LEDs 30. Optionally, an orthographic projection of the wavelength conversion layer 50 on a plane including the carrier substrate layer 40 and an orthographic projection of the plurality of micro LEDs 30 on the plane including the carrier substrate layer 40 at least partially overlap with each other. Optionally, the orthographic projection of the plurality of micro LEDs 30 on the plane including the carrier substrate layer 40 substantially covers the orthographic projection of the wavelength conversion layer 50 on a plane including the carrier substrate layer 40.

Various appropriate materials may be used for making the carrier substrate layer 40. Optionally, the carrier substrate layer 40 is a layer formed by patterning a mother substrate on which the plurality of micro LEDs 30 are grown. Optionally, the carrier substrate layer 40 is a layer formed by patterning a substrate onto which the plurality of micro LEDs 30 are transferred. Examples of appropriate materials for making the carrier substrate layer 40 include silicon, quartz, sapphire, as well as flexible materials such as polyimide, polycarbonate, polyethersulfone, polyethylene terephthalate, polyethylene naphthalate, polyarylate, and fiber-reinforced plastic. Optionally, the carrier substrate layer 40 is a transparent layer with respect to visible light. Optionally, the carrier substrate layer 40 is an opaque layer with respect to visible light. Optionally, the carrier substrate layer 40 is made of silicon, e.g., an amorphous silicon and a polycrystalline silicon.

In some embodiments, the carrier substrate layer 40 is made of a substantially non-transparent material with respect to visible light. As used herein, the term "substantially non-transparent" means at least 50 percent (e.g., at least 60 percent, at least 70 percent, at least 80 percent, at least 90 percent, and at least 95 percent) of light in the visible wavelength range not transmitted therethrough. Optionally, the carrier substrate layer 40 constitutes a black matrix for the micro LED display panel.

In some embodiments, the carrier substrate layer 40 is made of a substantially transparent material with respect to visible light. Optionally, the micro LED display panel further includes a black matrix.

Various appropriate materials may be used for making the wavelength conversion layer 50. Examples of appropriate materials for making the wavelength conversion layer 50 include phosphor and quantum dots. In some embodiments, the wavelength conversion layer 50 includes a plurality of first wavelength conversion blocks (e.g., a plurality of red light wavelength conversion blocks), a plurality of second wavelength conversion blocks (e.g., a plurality of green light wavelength conversion blocks), and a plurality of third wavelength conversion blocks (e.g., a plurality of blue light wavelength conversion blocks).

In some embodiments, the plurality of micro LEDs are a plurality of blue light emitting micro LEDs. Optionally, the wavelength conversion layer 50 includes a plurality of first wavelength conversion blocks and a plurality of second wavelength conversion blocks. Optionally, the plurality of first wavelength conversion blocks are a plurality of red light quantum dots blocks and the plurality of second wavelength conversion blocks are a plurality of green light quantum dots blocks. Optionally, the plurality of first wavelength conversion blocks are a plurality of red and green light quantum dots blocks, and the plurality of second wavelength conversion blocks are a plurality of red and green light quantum dots blocks, and the micro LED display panel further includes a color filter.

Referring to FIG. 1, in some embodiments, the micro LED display panel further includes an etch stop layer 60 on the carrier substrate layer 40 and substantially outside a region corresponding to the plurality of vias V. The etch stop layer 60 and the carrier substrate layer 40 define a plurality of subpixel apertures SA of the micro LED display panel. Each of the plurality of subpixel apertures SA of the micro LED display panel is approximately the light emitting region of one of a plurality of subpixels in the micro LED display panel.

In some embodiments, the carrier substrate layer 40 has a high etch selectivity with respect to the etch stop layer 60. As used herein, the term "etch selectivity" refers to a rate of removal of one material relative to another material. Optionally, an etch selectivity of an etchant between the carrier substrate layer 40 and the etch stop layer 60 is greater than 10:1, e.g., the carrier substrate layer 40 is removed by the etchant at a rate approximately ten times of a removal rate of the etch stop layer 60 using a same etchant. Optionally, the etch selectivity of an etchant between the carrier substrate layer 40 and the etch stop layer 60 is greater than 15:1, e.g., greater than 20:1, greater than 30:1, greater than 40:1, greater than 50:1, greater than 60:1, greater than 70:1, greater than 80:1, greater than 90:1, and greater than 100:1.

In some embodiments, the carrier substrate layer 40 has a high etch selectivity with respect to the etch stop layer 60 and a semiconductor layer (e.g., an n-GaN layer) of the plurality of micro LEDs 30 most adjacent to the wavelength conversion layer 50. Optionally, an etch selectivity of an etchant between the carrier substrate layer 40 and the etch stop layer 60 is greater than 10:1, e.g., the carrier substrate layer 40 is removed by the etchant at a rate approximately ten times of a removal rate of the etch stop layer 60 using a same etchant. Optionally, the etch selectivity of an etchant between the carrier substrate layer 40 and the etch stop layer 60 is greater than 15:1, e.g., greater than 20:1, greater than 30:1, greater than 40:1, greater than 50:1, greater than 60:1, greater than 70:1, greater than 80:1, greater than 90:1, and greater than 100:1. Optionally, an etch selectivity of the etchant between the carrier substrate layer 40 and the semiconductor layer of the plurality of micro LEDs 30 most adjacent to the wavelength conversion layer 50 is greater than 10:1, e.g., the carrier substrate layer 40 is removed by the etchant at a rate approximately ten times of a removal rate of the semiconductor layer of the plurality of micro LEDs 30 most adjacent to the wavelength conversion layer 50 using a same etchant. Optionally, the etch selectivity of an etchant between the carrier substrate layer 40 and the semiconductor layer of the plurality of micro LEDs 30 most adjacent to the wavelength conversion layer 50 is greater than 15:1, e.g., greater than 20:1, greater than 30:1, greater than 40:1, greater than 50:1, greater than 60:1, greater than 70:1, greater than 80:1, greater than 90:1, and greater than 100:1.

In some embodiments, the carrier substrate layer 40 includes silicon, and the etch stop layer 60 includes $SiN_aO_b$, wherein (a+b)>0. Examples of the materials for making the etch stop layer 60 include silicon oxide (SiOx), silicon nitride (SiNy), and silicon oxynitride (SiOxNy). Examples of etchants that selectively etches silicon but not $SiN_aO_b$ include chlorine-containing gas or plasma (e.g., $Cl_2$), fluorine-containing gas or plasma (e.g., $CF_4$, $C_2F_6$, $C_3F_8$, $SF_6$), potassium hydroxide, tetramethyl ammonium hydride, an acidic solution containing (hydrogen fluoride, nitric acid, and acetic acid), deep reactive ion etching (DRIE), and any combination thereof. Optionally, the etch selectivity of the etchant between the silicon and $SiN_aO_b$ is greater than 10:1, e.g., greater than 15:1, greater than 20:1, greater than 30:1, greater than 40:1, greater than 50:1, greater than 60:1, greater than 70:1, greater than 80:1, greater than 90:1, and greater than 100:1.

In some embodiments, the semiconductor layer of the plurality of micro LEDs 30 most adjacent to the wavelength conversion layer 50 includes gallium nitride (GaN), the carrier substrate layer 40 includes silicon, and the etch stop layer 60 includes $SiN_aO_b$, wherein (a+b)>0. Optionally, the plurality of vias V respectively extend through the carrier substrate layer 40, thereby exposing the semiconductor layer of the plurality of micro LEDs 30 most adjacent to the wavelength conversion layer 50. Optionally, a selective etchant is selected as discussed above, and parameters of the etching process are controlled such that the GaN exposed by the plurality of vias V are etched only to a limited degree, or substantially not etched. Optionally, the etch selectivity of the etchant between the silicon and $SiN_aO_b$ is greater than 10:1, e.g., greater than 15:1, greater than 20:1, greater than 30:1, greater than 40:1, greater than 50:1, greater than 60:1, greater than 70:1, greater than 80:1, greater than 90:1, and greater than 100:1. Optionally, the etch selectivity of the etchant between the silicon and GaN is greater than 10:1, e.g., greater than 15:1, greater than 20:1, greater than 30:1, greater than 40:1, greater than 50:1, greater than 60:1, greater than 70:1, greater than 80:1, greater than 90:1, and greater than 100:1.

Figure 2:
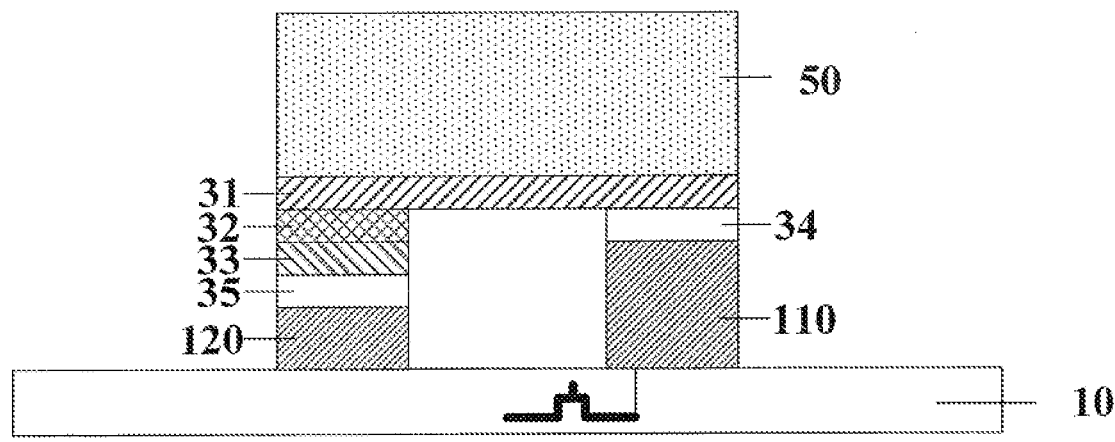
FIG. 2 is a schematic diagram illustrating the structure of one of the plurality of micro LEDs in a micro light emitting diode display panel in some embodiments according to the present disclosure.

Referring to FIG. 1, in some embodiments, the plurality of vias V respectively extend through the carrier substrate layer 40. Optionally, the wavelength conversion layer 50 is in direct contact with a semiconductor layer of the plurality of micro LEDs 30, the semiconductor layer being a layer most adjacent to the wavelength conversion layer 50 and exposed by the etching process. FIG. 2 is a schematic diagram illustrating the structure of one of the plurality of micro LEDs in a micro light emitting diode display panel in some embodiments according to the present disclosure. Referring to FIG. 2, each of the plurality of micro LEDs in some embodiments includes a first semiconductor layer 31, a multiple quantum well 32 (active layer), a second semiconductor layer 33, a first contact electrode 34, and a second contact electrode 35. Optionally, the first contact electrode 34 and the second contact electrode 35 are two different contact electrodes selected from a p-contact electrode and a n-contact electrode. Optionally, the first semiconductor layer 31 is an n-GaN layer, the second semiconductor layer 33 is a p-GaN layer, the first contact electrode 34 is an n-contact electrode, and the second contact electrode 35 is a p-contact electrode. Referring to FIG. 2, in some embodiments, the wavelength conversion layer 50 is in direct contact with the first semiconductor layer 31 (e.g., an n-GaN layer). Optionally, each of the plurality of micro LEDs in some embodiments further includes a first bonding contact 110 sandwiched between the first contact electrode 34 and the thin film transistor array substrate 10 to electrically connect the first contact electrode 34 to the thin film transistor array substrate 10, and a second bonding contact 120 sandwiched between the second contact electrode 35 and the thin film transistor array substrate 10 to electrically connect the second contact electrode 35 to the thin film transistor array substrate 10.

Figure 3:
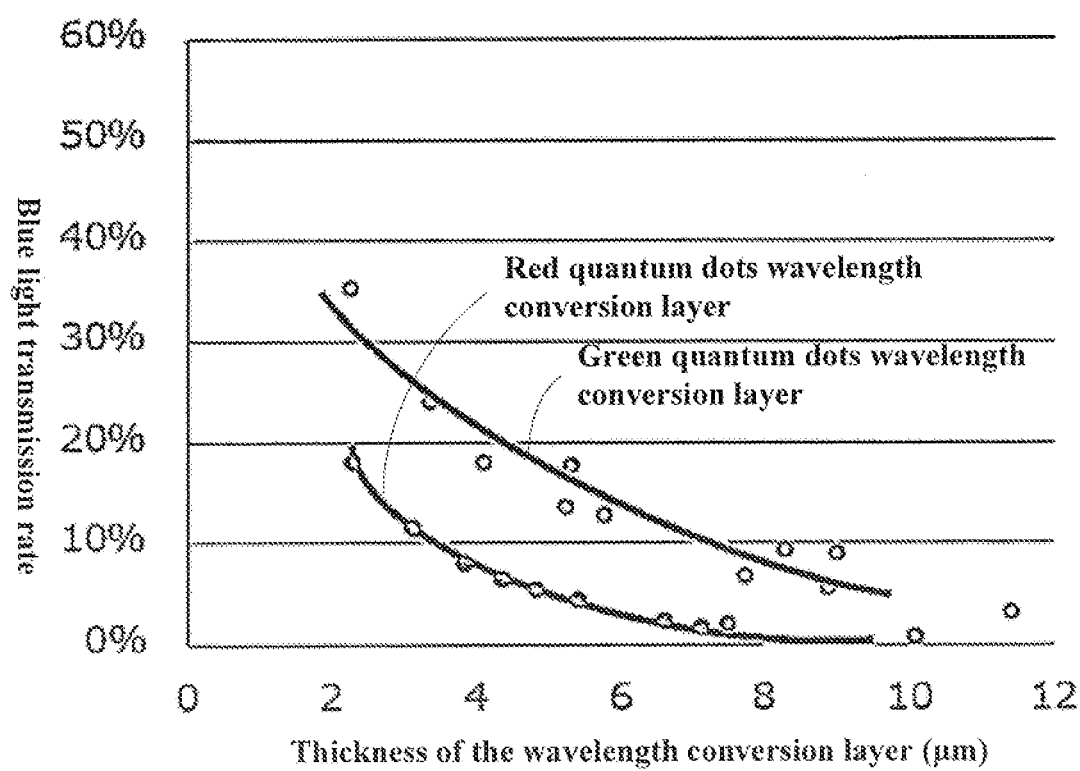
FIG. 3 illustrates a correlation between a thickness of a red quantum dots wavelength conversion layer and blue light transmission rate, and a correlation between a thickness of a green quantum dots wavelength conversion layer and blue light transmission rate.

As discussed above, in some embodiments, the plurality of micro LEDs 30 are micro LEDs emitting light of a first color. To enable color display, the wavelength conversion layer 50 is required to convert the light of the first color into light of a different color. In one example, the plurality of micro LEDs 30 are micro LEDs emitting blue light, and the wavelength conversion layer 50 converts the blue light into light of other colors such as red light and green light. In order to completely convert or otherwise absorb the blue light, the wavelength conversion layer 50 is required to have a certain thickness. FIG. 3 illustrates a correlation between a thickness of a red quantum dots wavelength conversion layer and blue light transmission rate, and a correlation between a thickness of a green quantum dots wavelength conversion layer and blue light transmission rate. As shown in FIG. 3, when the thickness of the wavelength conversion layer is greater than 10 µm, the blue light transmission can be reduced to a negligible level.

In a conventional micro LED display panel, it is difficult to pattern a wavelength conversion layer when the thickness exceeds a certain degree, also a relatively thick wavelength conversion layer in the conventional micro LED display panel can lead to interference issues between adjacent subpixels.

In the present micro LED display panel, by having the plurality of vias V extending into the carrier substrate layer 40, and by having the wavelength conversion layer 50 filled in the plurality of vias V, the wavelength conversion layer 50 having a relatively large thickness can be readily fabricated. Optionally, the wavelength conversion layer 50 has a thickness greater than 10 µm, e.g., greater than 20 µm, greater than 30 µm, greater than 40 µm, greater than 50 µm, greater than 60 µm, greater than 70 µm, greater than 80 µm, greater than 90 µm, and approximately 100 µm. Optionally, the wavelength conversion layer 50 has a thickness substantially same as a thickness of the carrier substrate layer 40. Optionally, the wavelength conversion layer 50 has a thickness greater than 10 µm and equal to or less than a thickness of the carrier substrate layer 40. As used herein, the term "substantially same" refers to a difference between two values not exceeding 10%, e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%.

Moreover, by forming the wavelength conversion layer 50 in the plurality of vias V, the carrier substrate layer 40, which defines the space to hold the wavelength conversion blocks, can be used as a black matrix when the carrier substrate layer 40 is made of a non-transparent material with respect to visible light. By having this design, interference between adjacent subpixels due to an increased thickness of the wavelength conversion layer 50 can be avoided.

Optionally, the wavelength conversion layer 50 is made of a substantially transparent material.

Optionally, the micro-LED display panel further includes a black matrix in an inter-subpixel region of the micro-LED display panel.

Referring to FIG. 1, in some embodiments, the micro LED display panel further includes a plurality of through holes 80 respectively extending through the carrier substrate layer 40, and a plurality of signal lines 90 respectively connected to electrodes of the plurality of micro LEDs 30 respectively through the plurality of through holes 80. For example, the plurality of signal lines 90 are respectively connected to p-contact electrodes of the plurality of micro LEDs 30 respectively through the plurality of through holes 80.

Referring to FIG. 1, in some embodiments, the micro LED display panel further includes a color filter layer 70. Optionally, the color filter layer 70 includes a plurality of color filter blocks, e.g., red color filter blocks, green color filter blocks, and blue color filter blocks. Optionally, the color filter layer 70 is on a side of the wavelength conversion layer 50 distal to the plurality of micro LEDs 30. Optionally, each individual one of the plurality of color filter blocks of the color filter layer 70 is on a side of a respective one of the plurality of wavelength conversion blocks of the wavelength conversion layer 50 distal to a respective one of the plurality of micro LEDs 30. Optionally, an orthographic projection of the color filter layer 70 on the plurality of micro LEDs 30 substantially cover an orthographic projection of the wavelength conversion layer 50 on the plurality of micro LEDs 30. Optionally, an orthographic projection of each individual one of the plurality of color filter blocks of the color filter layer 70 on a respective one of the plurality of micro LEDs 30 substantially cover an orthographic projection of a respective one of the plurality of wavelength conversion blocks of the wavelength conversion layer 50 on the respective one of the plurality of micro LEDs 30.

Referring to FIG. 1, in some embodiments, the micro LED display panel further includes a thin film transistor array substrate 10 having a plurality of thin film transistors TFT respectively configured to drive light emission of the plurality of micro LEDs 30. The plurality of micro LEDs 30 are bound to the thin film transistor array substrate 10. Optionally, the carrier substrate layer 40 is on a side of the plurality of micro LEDs 30 distal to the thin film transistor array substrate 10. Optionally, the etch stop layer 60 is on a side of the carrier substrate layer 40 distal to the thin film transistor array substrate 10. Optionally, orthographic projections of the plurality of micro LEDs 30 on the thin film transistor array substrate 10 substantially cover an orthographic projection of the wavelength conversion layer 50 on the thin film transistor array substrate 10. Optionally, an orthographic projection of each individual one of the plurality of micro LEDs 30 on the thin film transistor array substrate 10 substantially cover an orthographic projection of a respective one of the plurality of wavelength conversion blocks of the wavelength conversion layer 50 on the thin film transistor array substrate 10.

The thin film transistor array substrate 10 may be fabricated on any appropriate base substrate, e.g., a flexible base substrate and an inflexible base substrate. Examples of materials suitable for making the base substrate include, but are not limited to, glass, quartz, polyimide, polyethylene terephthalate, and polyester, etc. In one example, a flexible film is formed on a glass substrate, and the plurality of thin film transistors TFT are formed on the flexible film. When the fabrication of the display panel is complete, the glass substrate can be separated from the flexible film, thereby forming a flexible display panel. In another example, the flexible film (e.g., a polyimide film) is coated on the glass substrate.

Referring to FIG. 1, in some embodiments, the micro LED display panel further includes a bonding material layer 20 for bonding the plurality of micro LEDs 30 with the thin film transistor array substrate 10. Various appropriate bonding materials and bonding techniques may be used for bonding the plurality of micro LEDs 30 with the thin film transistor array substrate 10. In one example, the bonding material layer 20 is a metal bonding material layer (e.g., an indium/tin bonding layer). In another example, the bonding material layer 20 includes benzocyclobutene (BCB). In another example, the bonding material layer 20 is a solder layer. In another example, the bonding material layer 20 is a frit layer.

Figure 4:
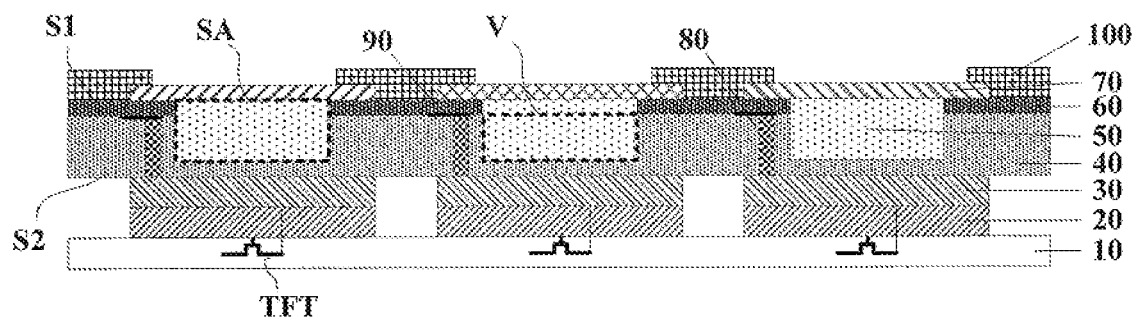
FIG. 4 is a schematic diagram illustrating the structure of a micro light emitting diode display panel in some embodiments according to the present disclosure.

FIG. 4 is a schematic diagram illustrating the structure of a micro light emitting diode display panel in some embodiments according to the present disclosure. Referring to FIG. 4, in some embodiments, the plurality of vias V extend through only one side (e.g., the first side S1) of the carrier substrate layer 40, but do not extend through the other side (e.g., the second side S2) of the carrier substrate layer 40. Optionally, the carrier substrate layer 40 is made of a substantially transparent material so that the remaining carrier substrate material between the wavelength conversion layer 50 and the plurality of micro LEDs does not substantially block light emitted from the plurality of micro LEDs.

Optionally, the micro LED display panel further includes a black matrix 100. Optionally, the black matrix 100 is in an inter-subpixel region of the micro LED display panel.

In another aspect, the present disclosure provides a method of fabricating a micro light emitting diode display panel. In some embodiments, the method includes forming a plurality of micro LEDs on a carrier substrate; forming a plurality of vias respectively extending into the carrier substrate, thereby forming a carrier substrate layer; and forming a wavelength conversion layer by filling a wavelength conversion material into the plurality of vias.

In some embodiments, prior to forming the plurality of vias respectively extending into the carrier substrate, the method further includes forming an etch stop layer on the carrier substrate layer and substantially outside a region corresponding to the plurality of vias. Optionally, the etch stop layer is formed to define a plurality of apertures corresponding to the plurality of vias. Optionally, subsequent to forming the etch stop layer, the method further includes selectively etching the carrier substrate using the etch stop layer as a mask plate and using a selective etchant to form the plurality of vias, thereby forming the carrier substrate layer. Optionally, the carrier substrate has a high etch selectivity with respect to the etch stop layer. The etch stop layer and the carrier substrate layer are formed to define a plurality of subpixel apertures of the micro LED display panel.

In some embodiments, selectively etching the carrier substrate includes etching through the carrier substrate using the selective etchant to form the plurality of vias extending through the carrier substrate layer. Optionally, the carrier substrate has a high etch selectivity with respect to the etch stop layer and a semiconductor layer of the plurality of micro LEDs exposed by selectively etching. Optionally, forming the wavelength conversion layer includes forming the wavelength conversion layer in direct contact with the semiconductor layer of the plurality of micro LEDs exposed by selectively etching.

In some embodiments, the etch stop layer is formed using a material including $SiN_aO_b$, wherein $(a+b)>0$; and the carrier substrate layer is formed using silicon (e.g., an amorphous silicon and a polycrystalline silicon). Optionally, the semiconductor layer of the plurality of micro LEDs exposed by selectively etching is made of a material including GaN.

In some embodiments, the method further includes forming a plurality of through holes respectively extending through the carrier substrate; and filling the plurality of through holes with a conductive material. The conductive material in each individual one of the plurality of through holes is connected to an electrode of a respective one of the plurality of micro LEDs. Optionally, the method further includes forming a plurality of signal lines respectively connected to electrodes of the plurality of micro LEDs respectively through the plurality of through holes.

In some embodiments, the method further includes forming a color filter layer on a side of the wavelength conversion layer distal to the plurality of micro LEDs. Optionally, the color filter layer is formed so that an orthographic projection of the color filter layer on the plurality of micro LEDs substantially cover an orthographic projection of the wavelength conversion layer on the plurality of micro LEDs.

In some embodiments, the method further includes forming a thin film transistor array substrate; and bonding the plurality of micro LEDs with the thin film transistor array substrate. The plurality of micro LEDs are formed to be respectively connected to a plurality of thin film transistors in the thin film transistor array substrate respectively configured to drive light emission of the plurality of micro LEDs. Optionally, forming the plurality of vias respectively extending into the carrier substrate is performed subsequent to bonding the plurality of micro LEDs with the thin film transistor array substrate.

Figure 5A:
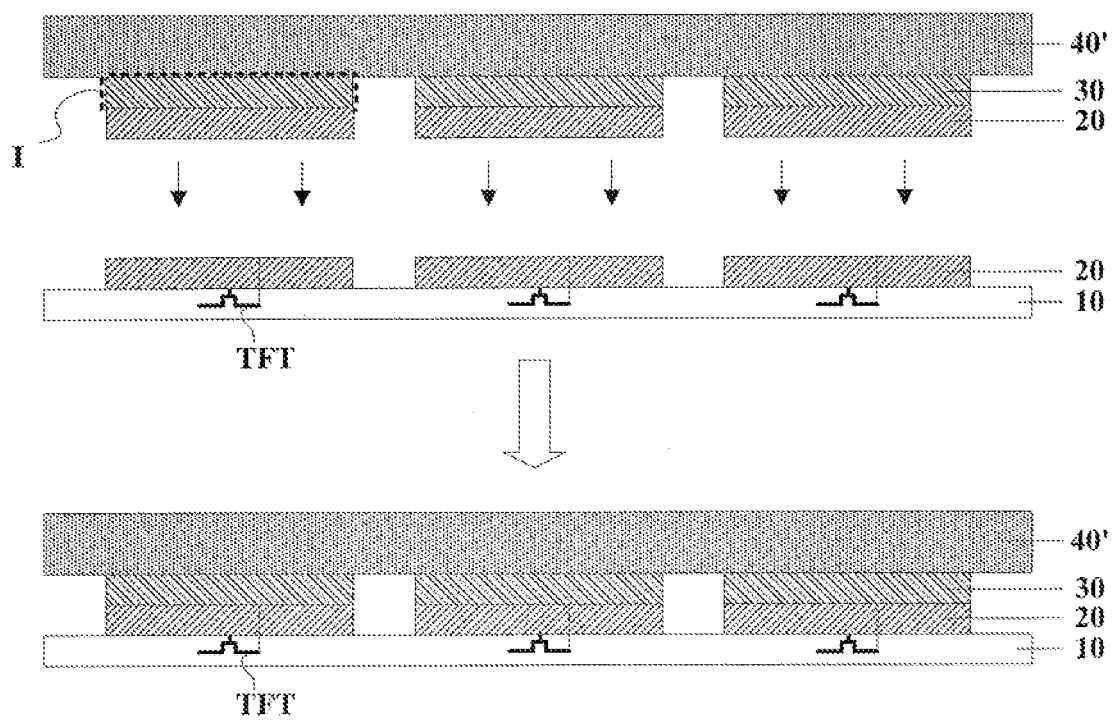
FIGS. 5A to 5G illustrate a process of fabricating a micro LED display panel in some embodiments according to the present disclosure.

FIGS. 5A to 5G illustrate a process of fabricating a micro LED display panel in some embodiments according to the present disclosure. Referring to FIG. 5A, a thin film transistor array substrate 10 is formed and provided. A plurality of micro LEDs 30 are formed on a carrier substrate 40'. The plurality of micro LEDs 30 are bonded with the thin film transistor array substrate 10 through a bonding material layer 20. In one example, the bonding material layer is a metal bonding material layer. Optionally, the metal bonding material layer includes one or a combination of indium and tin. Optionally, the plurality of micro LEDs 30 are formed as a plurality of light emitting islands I, each of the plurality of light emitting islands I includes one of the plurality of micro LEDs 30, constituting a subpixel of the micro LED display panel.

In some embodiments, layers of the plurality of micro LEDs 30 are first formed on the carrier substrate 40', followed by etching the layers of the plurality of micro LEDs 30 to form the plurality of light emitting islands I. Various appropriate etching methods may be used for forming the plurality of light emitting islands I. Examples of etching methods include, but are not limited to, reactive ion etching (RIE), deep reactive ion etching (DRIE), inductively coupled plasma etching (ICP), electron cyclotron resonance etching (ECR), and ion beam etching, and laser machining. Various etching gas may be used for dry etching. Examples of plasma etching gas include, but are not limited to, boron chloride ($BCl_3$) and chlorine ($Cl_2$). In some embodiments, the step of etching the layers of the plurality of micro LEDs 30 to form the plurality of light emitting islands I is performed using an inductively coupled plasma etching process. Examples of plasma etching gas for performing the inductively coupled plasma etching process includes boron chloride ($BCl_3$), carbon fluoride ($CF_4$), and chlorine ($Cl_2$).

Various appropriate bonding methods may be used for bonding the plurality of micro LEDs 30 with the thin film transistor array substrate 10. Examples of appropriate bonding methods include laser welding, infrared soldering, flip-chip bonding, and wafer bonding.

Figure 5B:
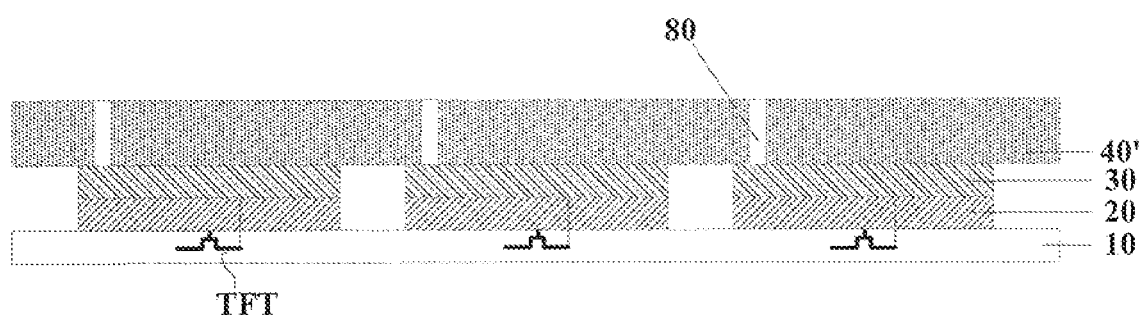

Referring to FIG. 5B, a plurality of through holes 80 are formed to extend through the carrier substrate 40'. Optionally, prior to forming the plurality of through holes 80, a chemical mechanical processing is performed on the carrier substrate 40' to reduce a thickness of the carrier substrate 40'. Optionally, a thickness of the carrier substrate 40' is reduced to be less than 100 μm.

Figure 5C:
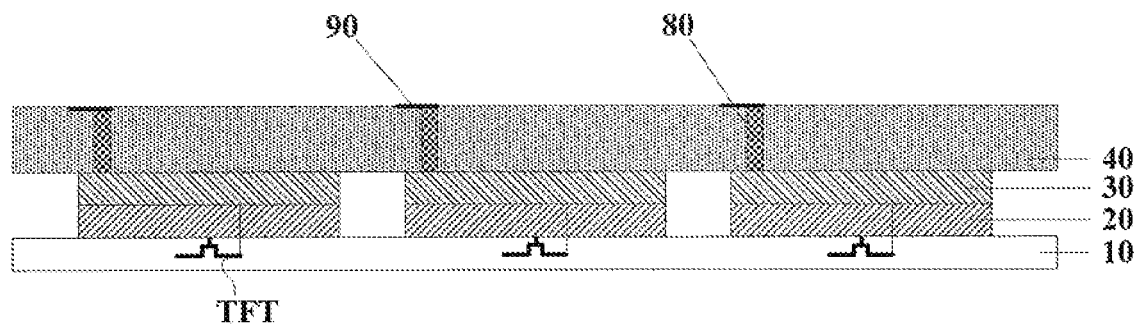

Referring to FIG. 5C, a conductive material (e.g., copper) is filled in the plurality of through holes 80. Various appropriate methods may be used for filling the plurality of through holes 80 with the conductive material. Examples of appropriate methods for filling the plurality of through holes 80 with the conductive material include electroplating and chemical vapor deposition. Optionally, subsequent to electroplating the conductive material into the plurality of through holes 80, the substrate is polished. Subsequently, a plurality of signal lines 90 are formed to be respectively connected to electrodes of the plurality of micro LEDs 30 respectively through the plurality of through holes 80.

Figure 5D:
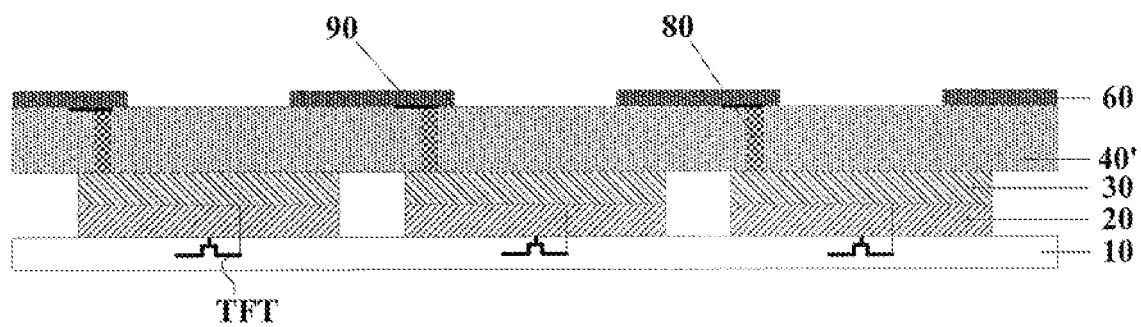

Referring to FIG. 5D, an etch stop layer 60 is formed on a side of the carrier substrate 40' distal to the thin film transistor array substrate 10. The etch stop layer 60 is formed to define a plurality of apertures corresponding to the plurality of vias (to be formed in a subsequent step). Various appropriate materials and various appropriate methods may be used for making the etch stop layer 60. In one example, the etch stop layer 60 is formed by lithography, e.g., by depositing an etch stop material layer followed by patterning the etch stop material layer to form the etch stop layer 60. In another example, the etch stop layer 60 is formed by treating the carrier substrate 40' with a plasma, thereby converting a portion of the carrier substrate 40' (e.g., a top surface of the carrier substrate 40'). In another example, the carrier substrate 40' is made of silicon, and the etch stop layer 60 is formed by treating the carrier substrate 40' with an oxygen-containing plasma to convert the silicon into silicon oxide.

In some embodiments, the etch stop layer 60 is made of a material so that the carrier substrate 40' has a high etch selectivity with respect to the etch stop layer 60. Optionally, an etch selectivity of an etchant between the carrier substrate 40' and the etch stop layer 60 is greater than 10:1, e.g., the carrier substrate 40' is removed by the etchant at a rate approximately ten times of a removal rate of the etch stop layer 60 using a same etchant. Optionally, the etch selectivity of an etchant between the carrier substrate 40' and the etch stop layer 60 is greater than 15:1, e.g., greater than 20:1, greater than 30:1, greater than 40:1, greater than 50:1, greater than 60:1, greater than 70:1, greater than 80:1, greater than 90:1, and greater than 100:1.

Figure 5E:
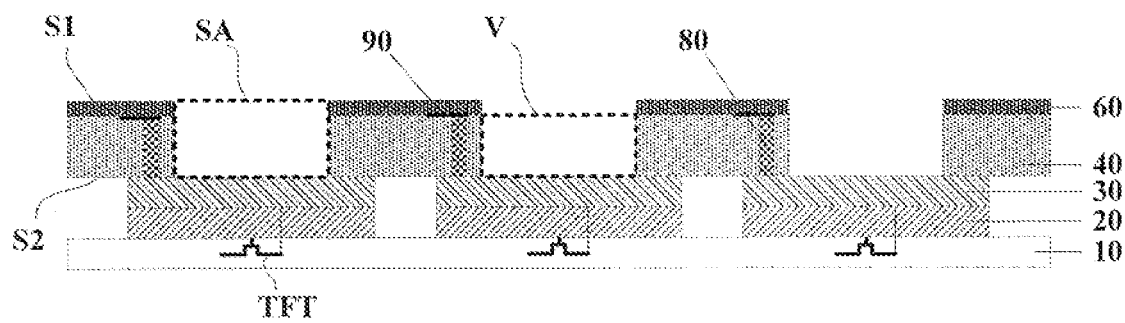

Referring to FIG. 5E, a plurality of vias V are formed to extend into the carrier substrate, thereby forming a carrier substrate layer 40. Optionally, as shown in FIG. 5E, the plurality of vias V are formed to extend through the carrier substrate layer 40. The etch stop layer 60 and the carrier substrate layer 40 are formed to define a plurality of subpixel apertures SA of the micro LED display panel. In one example, the plurality of vias V are formed by selectively etching the carrier substrate using the etch stop layer 60 as a mask plate and using a selective etchant. The carrier substrate has a high etch selectivity with respect to the etch stop layer 60, allowing the plurality of vias V to be formed. In one example, the carrier substrate is etched through to form the plurality of vias V extending through the carrier substrate layer 40.

Figure 5F:
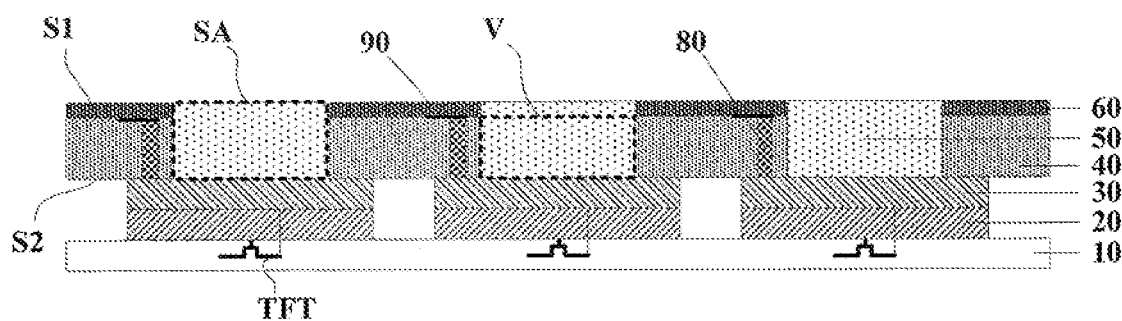

Referring to FIG. 5F, a wavelength conversion layer 50 is formed by filling a wavelength conversion material into the plurality of vias V. Optionally, the wavelength conversion layer 50 is formed to have a thickness greater than 10 μm. Optionally, the wavelength conversion layer 50 is formed to be in direct contact with a semiconductor layer of the plurality of micro LEDs 30 exposed by selectively etching.

Figure 5G:
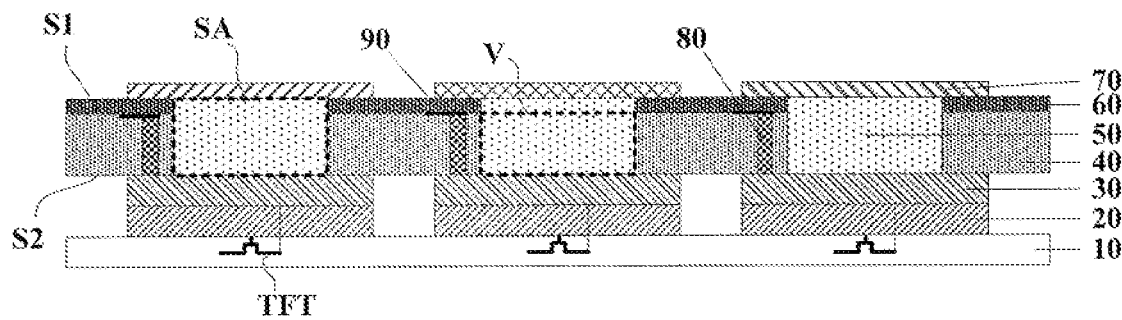

Referring to FIG. 5G, a color filter layer 70 is formed on a side of the wavelength conversion layer 50 distal to the plurality of micro LEDs 30. An orthographic projection of the color filter layer 70 on the plurality of micro LEDs 30 substantially cover an orthographic projection of the wavelength conversion layer 50 on the plurality of micro LEDs 30.

In another aspect, the present disclosure provides a micro light emitting diode display apparatus, having the micro LED display panel described herein or fabricated by a method described herein. Examples of appropriate micro light emitting diode display apparatuses include, but are not limited to, an electronic paper, a mobile phone, a tablet computer, a television, a monitor, a notebook computer, a digital album, a GPS, etc. Optionally, the micro light emitting diode display apparatus further includes one or more integrated circuits for driving image display in the micro LED display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A micro light emitting diode (micro LED) display panel, comprising:
   a carrier substrate layer, the micro LED display panel comprising a plurality of vias respectively extending into the carrier substrate layer;
   a plurality of micro LEDs on the carrier substrate layer;
   a wavelength conversion layer comprising a wavelength conversion material filled in the plurality of vias;
   a plurality of through holes respectively extending through the carrier substrate layer;
   a plurality of signal lines respectively connected to electrodes of the plurality of micro LEDs respectively through the plurality of through holes; and
   an etch stop layer on a side of the carrier substrate layer away from the plurality of micro LEDs and substantially outside a region corresponding to the plurality of vias;
   wherein the etch stop layer is on a side of the plurality of signal lines away from the plurality of through holes.

2. The micro LED display panel of claim 1, wherein an orthographic projection of the wavelength conversion layer on a plane comprising the carrier substrate layer and an orthographic projection of the plurality of micro LEDs on the plane comprising the carrier substrate layer at least partially overlap with each other.

3. The micro LED display panel of claim 1, wherein the etch stop layer and the carrier substrate layer define a plurality of subpixel apertures of the micro LED display panel;
   the etch stop layer is in direct contact with the carrier substrate layer and in direct contact with the plurality of signal lines; and
   an orthographic projection of the etch stop layer on a base substrate covers an orthographic projection of the plurality of signal lines on the base substrate.

4. The micro LED display panel of claim 1, wherein the carrier substrate layer has a high etch selectivity with respect to the etch stop layer.

5. The micro LED display panel of claim 4, wherein the carrier substrate layer has a high etch selectivity with respect to the etch stop layer and a semiconductor layer of the plurality of micro LEDs most adjacent to the wavelength conversion layer.

6. The micro LED display panel of claim 1, wherein the etch stop layer comprises a material comprising $SiN_aO_b$, wherein $(a+b)>0$; and
   the carrier substrate layer comprises silicon.

7. The micro LED display panel of claim 1,
   wherein a portion of the carrier substrate layer is between the wavelength conversion layer in a respective via of the plurality of vias and a semiconductor layer of the plurality of micro LEDs most adjacent to the wavelength conversion layer; and
   the portion of the carrier substrate layer is in direct contact with the wavelength conversion layer and is in direct contact with the semiconductor layer.

8. The micro LED display panel of claim 1, wherein the plurality of vias respectively extending through the carrier substrate layer.

9. The micro LED display panel of claim 8, wherein the wavelength conversion layer is in direct contact with a semiconductor layer of the plurality of micro LEDs most adjacent to the wavelength conversion layer.

10. The micro LED display panel of claim 1, wherein the wavelength conversion layer has a thickness greater than 10 μm.

11. The micro LED display panel of claim 1, wherein the wavelength conversion layer has a thickness substantially same as a thickness of the carrier substrate layer.

12. The micro LED display panel of claim 1, further comprising a color filter layer on a side of the wavelength conversion layer away from the plurality of micro LEDs;
   wherein an orthographic projection of the color filter layer on the plurality of micro LEDs substantially cover an orthographic projection of the wavelength conversion layer on the plurality of micro LEDs.

13. The micro LED display panel of claim 1, further comprising a thin film transistor array substrate;
   wherein the plurality of micro LEDs are bound to the thin film transistor array substrate, the thin film transistor array substrate comprising a plurality of thin film transistors respectively configured to drive light emission of the plurality of micro LEDs;
   the carrier substrate layer is on a side of the plurality of micro LEDs away from the thin film transistor array substrate; and
   orthographic projections of the plurality of micro LEDs on the thin film transistor array substrate substantially cover an orthographic projection of the wavelength conversion layer on the thin film transistor array substrate.

14. A micro light emitting diode (micro LED) display apparatus, comprising the micro LED display panel of claim 1.

15. A method of fabricating a micro light emitting diode (micro LED) display panel, comprising:
   forming a plurality of micro LEDs on a carrier substrate;
   forming a plurality of vias respectively extending into the carrier substrate, thereby forming a carrier substrate layer;
   forming a wavelength conversion layer by filling a wavelength conversion material into the plurality of vias;
   forming a plurality of through holes respectively extending through the carrier substrate layer;
   forming a plurality of signal lines respectively connected to electrodes of the plurality of micro LEDs respectively through the plurality of through holes; and
   forming an etch stop layer on a side of the carrier substrate layer away from the plurality of micro LEDs and substantially outside a region corresponding to the plurality of vias;
   wherein the etch stop layer is on a side of the plurality of signal lines away from the plurality of through holes.

16. The method of claim 15,
   wherein the etch stop layer is formed to define a plurality of subpixel apertures corresponding to the plurality of vias;
   the etch stop layer is in direct contact with the carrier substrate layer and in direct contact with the plurality of signal lines; and
   an orthographic projection of the etch stop layer on a base substrate covers an orthographic projection of the plurality of signal lines on the base substrate;
   wherein, subsequent to forming the etch stop layer, the method further comprises selectively etching the carrier substrate using the etch stop layer as a mask plate and using a selective etchant to form the plurality of vias, the carrier substrate having a high etch selectivity with respect to the etch stop layer, thereby forming the carrier substrate layer, the etch stop layer and the carrier substrate layer formed to define a plurality of subpixel apertures of the micro LED display panel.

17. The method of claim 16, wherein selectively etching the carrier substrate comprises etching through the carrier substrate using the selective etchant to form the plurality of vias extending through the carrier substrate layer, the carrier substrate has a high etch selectivity with respect to the etch stop layer and a semiconductor layer of the plurality of micro LEDs exposed by selectively etching.

18. The method of claim 17, wherein forming the wavelength conversion layer comprises forming the wavelength conversion layer in direct contact with the semiconductor layer of the plurality of micro LEDs exposed by selectively etching.

19. The method of claim 15,
wherein forming the plurality of signal lines comprises filling the plurality of through holes with a conductive material, the conductive material in each individual one of the plurality of through holes connected to an electrode of a respective one of the plurality of micro LEDs;
a portion of the carrier substrate layer is between the wavelength conversion layer in a respective via of the plurality of vias and a semiconductor layer of the plurality of micro LEDs most adjacent to the wavelength conversion layer; and
the portion of the carrier substrate layer is in direct contact with the wavelength conversion layer and is in direct contact with the semiconductor layer.

20. The method of claim 15, further comprising:
forming a thin film transistor array substrate; and
bonding the plurality of micro LEDs with the thin film transistor array substrate, the plurality of micro LEDs being respectively connected to a plurality of thin film transistors in the thin film transistor array substrate respectively configured to drive light emission of the plurality of micro LEDs.

* * * * *